United States Patent [19]
Patel et al.

[11] Patent Number: 5,263,245
[45] Date of Patent: Nov. 23, 1993

[54] METHOD OF MAKING AN ELECTRONIC PACKAGE WITH ENHANCED HEAT SINKING

[75] Inventors: Maganlal S. Patel, Endicott; John J. Zopff, Binghamton, both of N.Y.

[73] Assignee: International Business Machines Corporation, Armonk, N.Y.

[21] Appl. No.: 19,408

[22] Filed: Feb. 16, 1993

Related U.S. Application Data

[62] Division of Ser. No. 826,574, Jan. 27, 1992, Pat. No. 5,220,487.

[51] Int. Cl.⁵ .............................................. H05K 3/34
[52] U.S. Cl. ........................................ 29/840; 29/832; 174/16.3; 257/675; 257/712
[58] Field of Search ................ 257/675, 712; 29/840, 29/832; 174/52.4, 52.2, 163

[56] References Cited

U.S. PATENT DOCUMENTS

| | | | |
|---|---|---|---|
| 3,665,256 | 5/1972 | Goun et al. | 257/675 X |
| 3,825,803 | 7/1974 | Budde | 174/52.4 X |
| 3,930,114 | 12/1975 | Hodge | 174/52.4 |
| 4,563,725 | 1/1986 | Kirby | 174/52.4 X |
| 4,654,966 | 4/1987 | Kohara et al. | 29/840 |
| 4,718,163 | 1/1988 | Berland et al. | 29/840 X |
| 4,724,611 | 2/1988 | Hagihara | 29/840 |
| 5,175,612 | 12/1992 | Long et al. | 257/675 X |

FOREIGN PATENT DOCUMENTS 58-193558  8/1983  Japan ..................... 257/675

*Primary Examiner*—Carl J. Arbes
*Attorney, Agent, or Firm*—Lawrence R. Fraley

[57] ABSTRACT

An electronic package which includes a substrate having a dielectric layer, a circuitized layer located on one surface of the dielectric and a thermally and electrically conductive layer located on a second surface of the dielectric, this thermally and conductive layer designed for providing enhanced heat removal from the package's semiconductor device. A pedestal element is located on or formed as part of the thermal and electrically conductive layer, and extends through the dielectric and circuitized layers for having the semiconductor device positioned thereon. The semiconductor device is thus in substantially direct thermal communication with the pedestal element and thus the adjacent, thick thermal conductive layer which functions as the package's heat sink. In one embodiment, solder is provided on the pedestal element to interconnect desired portions of the circuitized layer with the pedestal element (e.g., to provide electrical ground). A method of making such an electronic package is also defined herein.

12 Claims, 3 Drawing Sheets

METHOD OF MAKING AN ELECTRONIC PACKAGE WITH ENHANCED HEAT SINKING

This application is a divisional application of Ser. No. 07/826,574, filed Jan. 27, 1992and entitled "Electronic Package with Enhanced Heat Sinking" (Inventors: M. Patel and J. Zopff). Ser. No. 07/826,574, is now U.S. Pat. No. 5,220,487, having issued Jun. 15, 1993.

TECHNICAL FIELD

The present invention relates to electronic packages and more particularly to electronic packages for use in information handling systems (computers).

BACKGROUND OF THE INVENTION

Typically, electronic packages of the type mentioned above include a circuitized substrate (e.g., printed circuit board) and a semiconductor device (chip) electrically coupled thereto. Several examples of these are known in the art including those defined in U.S. Pat. Nos. 4,849,856 (Funari et al), 4,914,551 (Anschel et al), 4,326,238 (Takeda et al), 4,698,662 (Young et al), 4,729,061 (Brown) and 5,012,386 (McShane). Understandably, a major factor in the successful operation of such packages involves effective heat removal from the package, and particularly the semiconductor device(s) utilized as part thereof. Such heat removal may be accomplished using a heat sink structure such as the type defined in the aforementioned U.S. Pat. Nos. 4,849,856 and 4,914,551. As defined therein, the semiconductor device is thermally coupled to these heat sink members such that the heat generated by the device passes thereto for eventual dissipation into the ambient surrounding the package.

In a more recent version of such package structures, the package substrate includes a relatively thick thermal and electrically conductive (e.g., copper) layer having thereon a dielectric material (e.g., fiberglass reinforced epoxy resin) which in turn includes a desired circuitization layer (e.g., copper) thereon. Such a structure is defined in co-pending application Ser. No. 07/598,466, entitled, "Electrical And/Or Thermal Interconnections And Methods For Obtaining Such", filed Oct. 9, 1990. This application is incorporated herein by reference. As defined in Ser. No. 07/598,466, various apertures are provided within the structure to promote heat transference from the operating semiconductor device to the thickened copper layer located thereunder, these apertures, in one embodiment, including a quantity of conductive material (e.g., copper) plated along the surfaces thereof or, in another embodiment, including solder or the like within the aperture. In both instances, heat generated from the semiconductor device passes to an adjacent heat spreader or the like and then into the thermally conductive apertures, which apertures extend within or through the thick copper layer. Understandably, this thick copper layer functions as a heat sink for the package.

In accordance with the teachings herein, the present invention provides an improved heat sinking package over the embodiments defined in Ser. No. 07/598,466 by eliminating the need for apertures or the like within the structure, while still assuring greater heat dissipation for the final package.

It is believed that such an electronic package would constitute a significant advancement in the art.

DISCLOSURE OF THE INVENTION

It is, therefore, a primary object of the present invention to enhance the electronic package art.

It is another object of the present invention to provide an electronic package with improved heat sinking over packages such as defined in Ser. No. 07/598,466.

It is a further object of the invention to provide such an electronic package which can be produced using known techniques and is also adaptable for production on a relatively large scale so as to benefit from the several advantages thereof.

It is a still further object of the present invention to provide a method for making such a package.

In accordance with one aspect of the invention, there is provided an electronic package which comprises a substrate having a dielectric layer, a circuitized layer located on a first surface of the dielectric layer, and a thermally and electrically conductive layer located on a second surface of the dielectric layer. The thermally and electrically conductive layer includes a pedestal element located thereon or forming part thereof such that the pedestal element extends through both the dielectric and circuitized layers so as to project a predetermined distance above the circuitized layer. The package further includes a semiconductor device positioned atop the pedestal element and in thermal communication therewith so that the pedestal element provides an enhanced path of heat flow from the semiconductor device during package operation.

In accordance with another aspect of the invention, there is provided a method of making an electronic package which comprises the steps of providing a thermally and electrically conductive layer, providing a dielectric layer on the thermally and conductive layer, providing a circuitized layer on the dielectric layer, forming a pedestal element within the thermally and electrically conductive layer such that the pedestal element extends through both the dielectric layer and the circuitized layer so as to project a predetermined distance above the circuitized layer, and positioning a semiconductor device atop the pedestal element such that the device is in thermal communication with the pedestal element.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
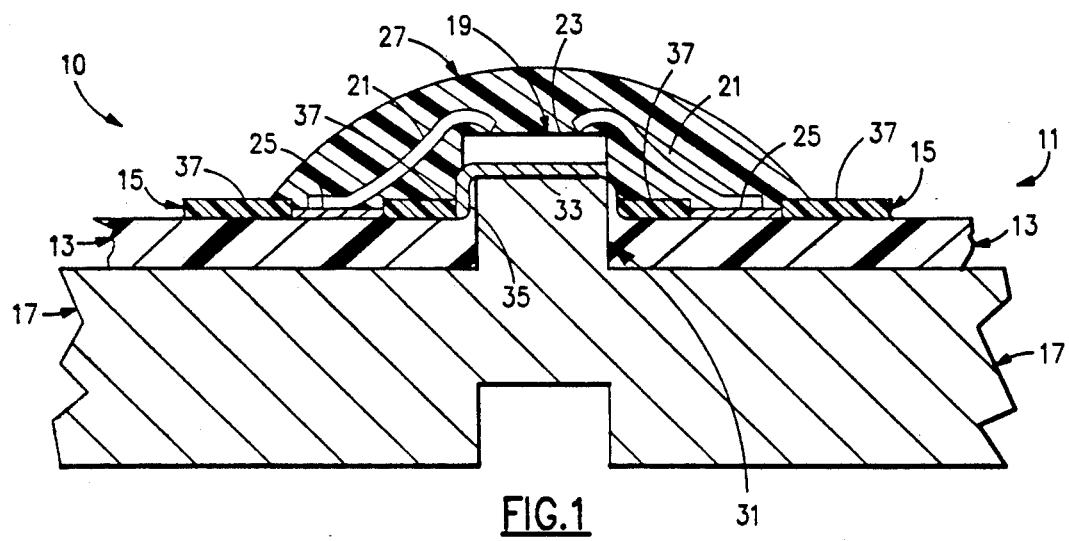
FIG. 1 is an enlarged, side elevational view, in section, of an electronic package in accordance with a preferred embodiment of the invention.

In FIG. 1, there is shown an electronic package 10 in accordance with a preferred embodiment of the invention. Package 10 includes a substrate 11 which in turn includes a dielectric layer 13, a circuitized layer 15 located atop layer 13, and a thermally and electrically conductive layer 17 located on the opposite surface of the interim dielectric layer 13 from the circuitized layer 15. In accordance with a preferred embodiment of the invention, circuitized layer 15 is comprised of copper and formed on dielectric layer 13 using known photolithographic techniques. Three ounce copper is used for layer 15, this layer having an overall thickness of only about 0.004 inch. Dielectric layer 13, preferably of fiberglass reinforced epoxy resin (a known material, also referred to as FR-4 material) possesses a thickness of about 0.006 inch, while the thermal and electrically conductive layer 17, in accordance with one embodiment, possesses a thickness as great as 0.040 inch. Thus, this relatively thicker layer 17 assures effective heat removal from package 10 if properly thermally coupled to the heat generating elements thereof. Layer 17 is preferably from about seven to about ten times thicker than layer 15.

Package 10 further includes a semiconductor device 19 which, as defined herein, is thermally coupled to layer 17 and also electrically coupled to respective portions of the circuitry which forms circuitized layer 15. Such connections are preferably achieved using individual wiring (e.g., aluminum) 21 with such wires respectively interconnecting an individual contact site (not shown) on the upper surface 23 of device 19 to respective contact portions (pads) 25 which form part of the circuitry for circuitized layer 15. Preferably, these contact portions 25 are comprised of a very thin layer (e.g., 0.0005 inch) of a precious metal, such as gold. This excellent conductive material may be applied to respective locations on the copper portion of circuitized layer 15 using known techniques and further description is not believed necessary. The wire members 21 (e.g., having a diameter of about 0.002 inch) are preferably connected to the respective contact sites and contact portions using known techniques (e.g., ultrasonic bonding).

In a preferred embodiment of the invention, a quantity of encapsulant material 27 is applied over the semiconductor device 19, wire member 21 and portions of circuitized layer 15 to the extent such as shown in FIG. 1.

In accordance with the teachings of the present invention, the invention's thermal and electrically conductive layer 17 includes a pedestal element 31 which may be attached (e.g., soldered or welded) to layer 17 or may form an integral part thereof. Preferably, element 31 comprises an integral part of layer 17 and is formed using a coining operation as defined hereinbelow.

Significantly, pedestal element 31 extends through dielectric layer 13 and circuitized layer 15 so as to project a predetermined distance (e.g., from about 0.001 inch to about 0.005 inch) above the upper surface of circuitized layer 15. The reason for such projection will be understood from the description provided below.

Semiconductor device 19 is preferably thermally coupled to pedestal element 31 using a quantity of solder 33 (e.g., 63:37 tin:lead solder, a type known in the art wherein the tin portion constitutes approximately 63% of the composition's total while the lead constitutes approximately 37%). Significantly, this solder material, being electrically conductive, projects from the common interface between the semiconductor device's bottom surface and the upper surface of element 31 to physically engage and thus be electrically coupled to circuitized layer 15. Such a projecting portion of the solder material 33 is represented by the numeral 35 is FIG. 1. Such connection may be highly desired in a package such as depicted herein to interconnect desired portions of the circuitry of layer 15 with the larger, electrically conductive layer 17 (e.g., to provide electrical ground). Formation of this connection will be defined in greater detail hereinbelow.

Package 10 may also include a layer of insulative material 37 thereon, which insulative material is applied during the manufacture of package 10 to provide the features described hereinbelow. A preferred insulative material is Probimer 601, such material described in Ser. No. 07/598,466 and also known in the art. (Probimer is a trademark of the Ciba-Geigy Corporation.)

This material serves to protect various portions of the circuitized layer located thereunder during the various processing steps employed to produce the present invention.

In one embodiment of the invention, pedestal element 31 was of substantially rectangular (e.g., square) configuration (when viewed from the top in FIG. 1), while semiconductor device 19 was also of rectangular configuration (when viewed from the top in FIG. 1). In this example, pedestal element 31 possessed side dimensions of 0.167 inch and 0.167 inch, in comparison to the semiconductor device which possessed side dimensions of 0.175 inch and 0.175 inch. Accordingly, the semiconductor device possesses an overall larger surface area facing pedestal element 31 in comparison to the element's corresponding surface area. This size difference is considered important for the reasons described herein.

Figure 8:
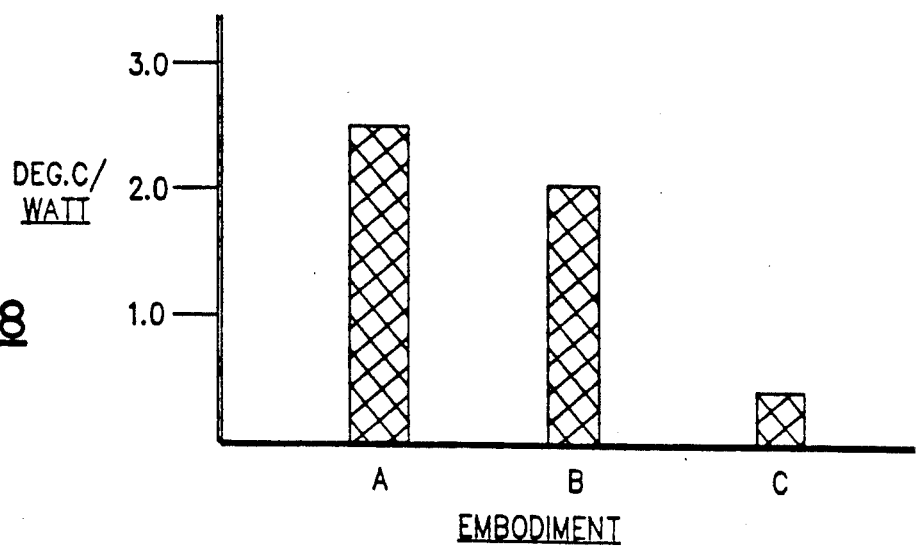
FIG. 8 is a graph showing the improved heat dissipation capabilities of the present invention in comparison to two embodiments utilizing apertures within the electronic structure.

The electronic package of the present invention, as stated above, provides enhanced heat sinking over the structure defined in Ser. No. 07/598,466. By way of example, and as shown in FIG. 8, the package of the invention provides effective heat dissipation at a rate of from about 0.25 to about 0.75 degrees Celsius (C) per operational watt of the invention's semiconductor device. Specifically, package 10 is particularly designed for relatively high wattage semiconductor devices, with typical operational wattages of about 8 to 10 watts. At such relatively high wattages, heat generation is relatively large during package operation and such heat must be effectively removed from the package to assure optimum operation. Semiconductor devices such as the above are known, and may operate at elevated temperatures as high as about 110 degrees C. (The higher the wattage, the higher the temperature the device operates at.) By the term degrees C per watt is meant to define the temperature difference, per individual operational watt of device 19, between the device and heat sinking layer 17. Understandably, the greater the difference between these two elements the less thermal heat sinking occurs. Accordingly, it is strongly desired to reduce this differential to the greatest extent possible. In FIG. 8, embodiments A and B provide, respectively, heat dissipation values of about 2.5 and 2.0 degrees C per watt. Embodiments A and B represent the aforedefined structures such as defined in Ser. No. 07/598,466 wherein thermally conductive apertures are used to heat sink the semiconductor device's generated heat through to the thick copper underlayer. The embodiment A represents that version wherein plated through holes extending from the structure's heat spreader through the entirety of the thicker copper underlayer were utilized, each of these through holes including copper plating thereon to aid in heat removal. The embodiment B represents an apertured version of such a structure, as described above, wherein apertures were provided a pre-established depth into the thicker copper underlayer and filled with a thermal conductive material such as solder. In both examples, a maximum of only about two degrees C per watt in temperature differential was realized.

In FIG. 8, embodiment C represents the values obtained using the unique teachings of the present invention. As shown, embodiment C provides a heat dissipation value of only about 0.5 degrees C. per watt. Thus, for a semiconductor device operating at 10 watts, the invention provides a temperature differential between device 19 and copper layer 17 of only about five degrees C. In comparison, the next most efficient structure (embodiment B) provides a temperature differential approximately four times this amount, or about 20 degrees C. The invention is thus able to provide significantly enhanced heat sinking over embodiments such as those defined in Ser. No. 07/598,466 and thus benefit from the several advantages of such enhanced heat removal.

In FIGS. 2-7, there are shown various steps in making the package of the present invention.

Figure 2:
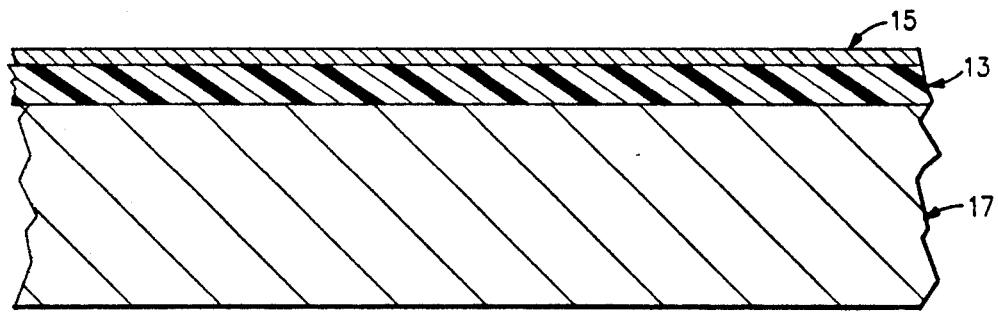
FIGS. 2-7 represent various steps in the method of making the electronic package of FIG. 1.

In FIG. 2, a copper layer 17 having a thickness of about 0.040 inch is provided and a layer of polymer is applied thereon. This polymer, preferably fiberglass reinforced epoxy resin as defined above, is preferably applied in accordance with the teachings of Ser. No. 07/598,466, the disclosure of which is incorporated herein by reference. Once layer 13 is applied and cured appropriately, circuitization layer 15 is applied, using a photolithographic process, several types of which are known in the art. This subassembly is then positioned within a punch press and a punch is used to form element 31. Use of such a punch represents part of a coining operation and is accomplished using equipment known in the art. Further description is thus not believed necessary.

Figure 3:
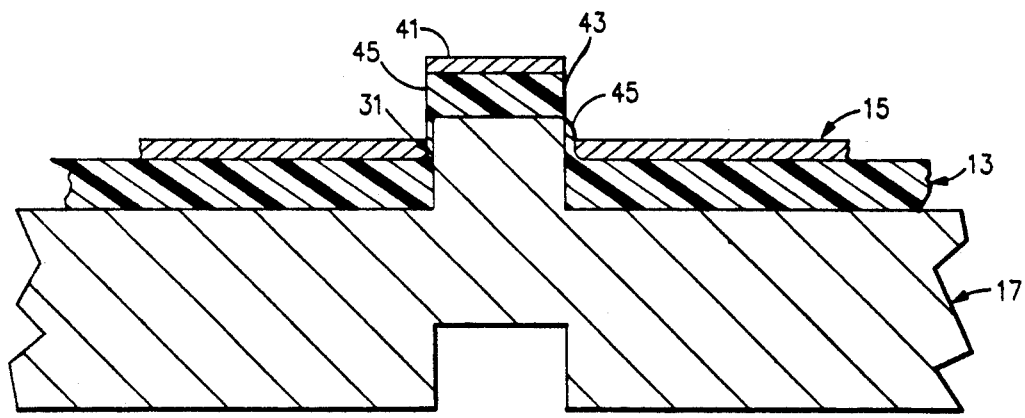

In FIG. 3, element 31 has been formed (the punching of layer 17 occurring, obviously from the bottom of layer 17 in the view shown in FIG. 3). With element 31 so formed, the element 31 extends through the somewhat elastic polymer material of layer 13 and separates a segment 41 of the circuitized layer 15 from layer 15. Additionally, a corresponding portion 43 of the dielectric polymer is also forced upwardly during the coining operation. Because of the elasticity of this material, however, stretched portions thereof remain and are represented in the view of FIG. 3 by the numerals 45. Accommodation for these stretched portions of the dielectric constitute a significant aspect of the invention and will be described hereinbelow.

Figure 4:
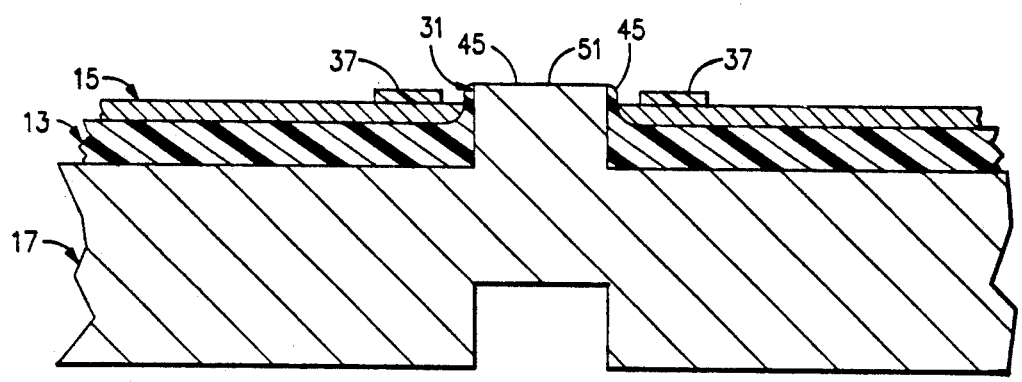
Figure 5:
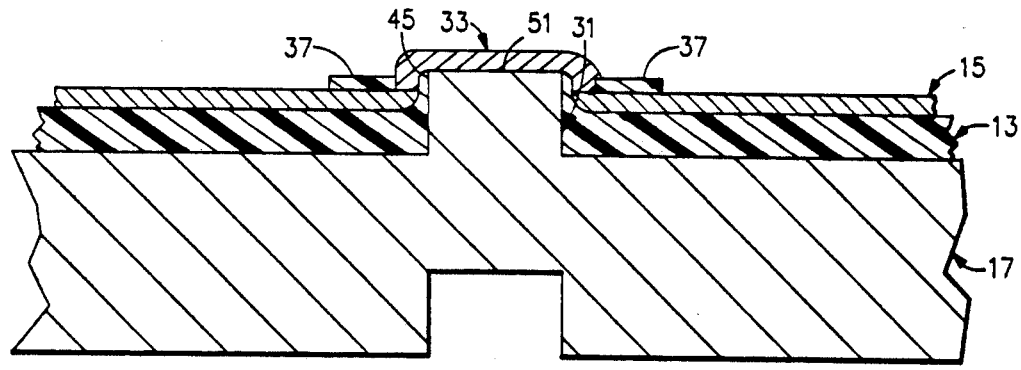
Figure 6:
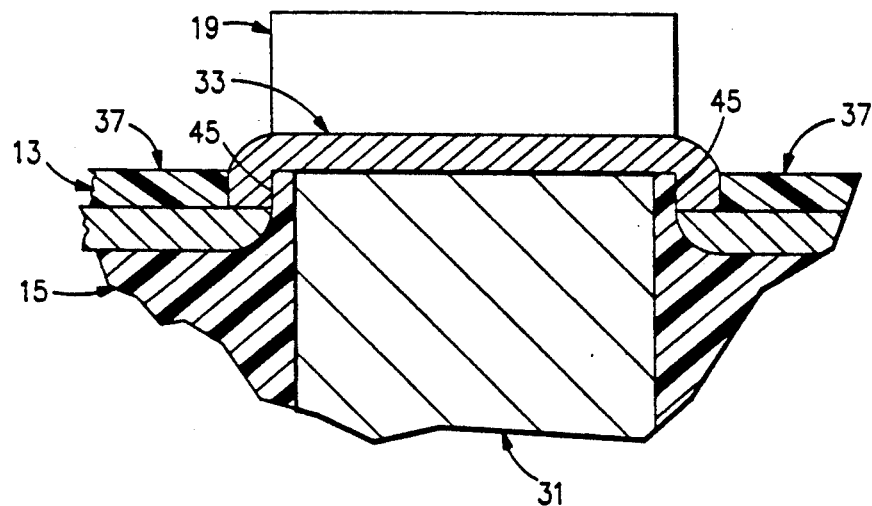

In FIG. 4, an upper portion of element 31 has been removed to provide a substantially planar upper surface 51. The preferred removal operation involves a milling process wherein the subassembly is placed within a milling machine, several examples of which are known in the art and further description not believed necessary. Approximately 0.002 inch of element 31 is removed such that the planar surface 51 occupies a height of only about 0.001 inch to about 0.0035 inch above the adjacent upper surface of circuitry 15. It is thus considered important that element 31 extend above layer 15 such that removal thereof will not result in damage to the relatively delicate circuitized layer located adjacent thereto. In the next step in FIG. 4, a quantity of Probimer material 37 is applied to substantially surround the elevated pedestal element (and the contiguous, stretched dielectric portions 45). This Probimer is preferably Probimer 601, and applied using techniques such as described in Ser. No. 07/598,466.

With the Probimer 601 in position, the next step in producing package 10 includes positioning a quantity of the solder material 33 on the planar surface 53 and extending thereover to be retained within the boundary defined by the inner surfaces of the Probimer material 37. Solder material 33 is preferably applied using a screening operation wherein the solder, preferably 63:37 tin:lead, is applied using a squeegee and dispensed through a stencil positioned on the substrate. Understandably, prior to this paste application, it may be desirable to clean the upper surfaces of the substrate (e.g., using water or similar liquid). An alternative material is a water soluble solder paste sold under the trade name W/S 1208 solder paste, available from Alpha Metals, Inc. (Alpha is a trademark of Alpha Metals, Inc.) This solder paste is a eutectic solder, containing about 63 percent tin and 37 percent lead.

The solder material 33 is applied to a thickness of about 0.009 inch to about 0.011 inch. Following solder application, semiconductor device 19 is aligned (e.g., using robotics) relative to the solder and positioned thereon, the resulting positioning from this step in the operation shown in FIG. 6. With device 19 located on the solder 33 (the solder in paste form), this subassembly is then heated to a temperature (e.g., about 200 degrees C.) greater than the melting point of the solder. Such heating preferably occurs for a period of from about 1 to about 1.5 minutes, the subassembly positioned within an infrared (IR) oven for this purpose. Immediately prior to such solder reflow at this elevated temperature, it is preferred to substantially dry the paste by heating this material to a temperature of about 105 degrees C. to about 130 degrees C. for a period of only about 2-5 minutes, this temperature substantially below the melting point of the solder but sufficient to substantially dry the material and thereby facilitate positioning of semiconductor device 19 thereon.

Figure 7:
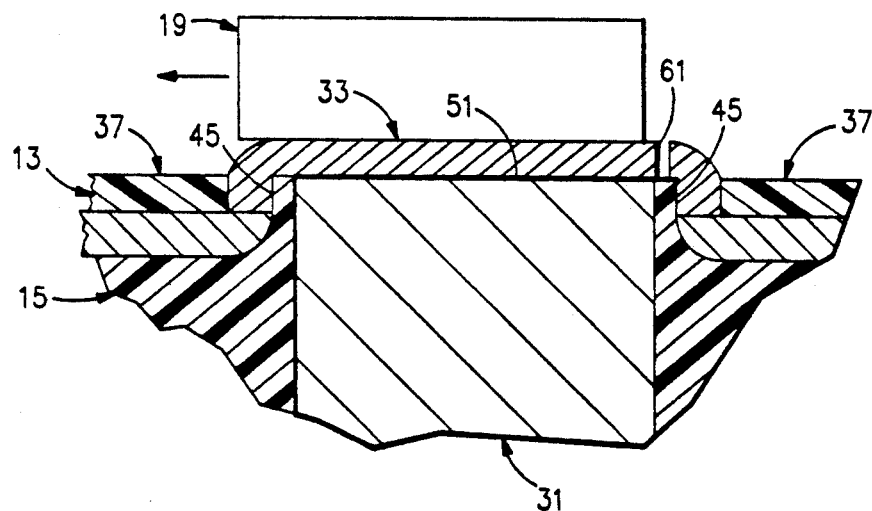

During the solder reflow operation, semiconductor device, significantly, moves laterally (as shown in FIG. 7) so as to be slightly offset with respect to the corresponding planar surface 51 of element 31 located thereunder. This is considered a very significant step in producing the present invention in that it assures effective electrical connection between solder 33 and a portion of circuitized layer 15 in the manner shown in FIG. 7. As stated, such connection may be deemed necessary to provide electrical interconnection between the invention's circuitized layer and corresponding thermal and electrically conductive, thicker layer. It has been determined that providing device 19 in a slightly offset orientation relative to the pedestal element 31 and thus assuring that a portion of the device is located immediately above one (that to the left in FIG. 7) of the stretched dielectric portions 45, assures to substantially prevent outgassing from this polymer material during elevated temperatures thereof, which outgassing may result in voids 61 within the solder 33. Such voids, as depicted in FIG. 7 for an uncovered portion of the solder and adjacent stretched polymer, may result in a break in connection within the solder. Understandably, the present invention thus assures a sound electrically conductive path between the circuitry of circuitized layer 15 through the pedestal element 31 into layer 17, should such connection be desired (e.g., to provide electrical ground). Surprisingly, semiconductor device 19 moves no further than to approximately the inner edge of the adjacent Probimer material 37 during such solder reflow.

Solder material 33 is then cooled and solidification occurs. Following a cleaning (chemical or water) operation, the desired wire bonding of wire members 21 occurs and encapsulant 27 is then applied. A preferred encapsulant is available from the Dexter Corporation (Olean, N.Y.) and sold under the trade name Hysol FP4323. (Hysol is a registered trademark of the Dexter Corporation.) Hysol FP4323 is a flowable, liquid epoxy gel material which features low viscosity and low stress, both of said features desirable for use in package structures of the type described herein. The invention is not limited to use of only this material, however, in that other encapsulant materials known in the art may be used. Further description is thus not believed necessary.

Following baking of the encapsulant (e.g., at a temperature of about 165 degrees C. for about 3 hours in a hot air oven), the structure is now subjected to various testing and then considered acceptable for incorporation within a larger electronic structure which in turn forms part of the final system (e.g., computer) using the present invention.

Thus there has been shown and described an electronic package which assures enhanced heat removal to thereby in turn assure optimum operation thereof. The package as defined herein can be produced using the techniques defined herein, which techniques are understandably adaptable to mass production.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of making an electronic package, said method comprising:
   providing a thermally and electrically conductive layer;
   providing a dielectric layer on said thermally and conductive layer;
   providing a circuitized layer on said dielectric layer;
   forming a pedestal element within said thermally and electrically conductive layer, said pedestal element extending through both said dielectric layer and said circuitized layer so as to project a predetermined distance above said circuitized layer; and
   positioning a semiconductor device atop said pedestal element such that said semiconductor device is in thermal communication within said pedestal element.

2. The method according to claim 1 wherein said circuitized layer is provided using a photolithographic process.

3. The method according to claim 1 wherein said pedestal element is formed using a coining process.

4. The method according to claim 3 further including removing a portion of said pedestal element following said coining process.

5. The method according to claim 4 wherein said removing of said portion of said pedestal element is accomplished using a milling process.

6. The method according to claim 4 further including providing a quantity of electrically conductive material on said pedestal element following said removing of said portion thereof.

7. The method according to claim 6 wherein said electrically conductive material is solder, said solder being applied on said pedestal element using a screening process.

8. The method according to claim 6 further including heating said electrically conductive material to a temperature above the melting point thereof.

9. The method according to claim 6 further including positioning said semiconductor device on said electrically conductive material and thereafter heating both said semiconductor device and said electrically conductive material to cause said semiconductor device to move on said electrically conductive material so as to be offset with respect to said pedestal element.

10. The method according to claim 1 further including electrically interconnecting contact sites of said semiconductor device with respective portions of said circuitized layer.

11. The method according to claim 10 wherein said electrically interconnecting said contact sites and said respective portions of said circuitized layer is accomplished using a plurality of wire members, said wire members being thermocompression bonded to said contact sites and said respective portions.

12. The method according to claim 1 further including providing a quantity of encapsulant material over said semiconductor device and portions of said circuitized layer.

* * * * *